(12) United States Patent
Roohparvar

(10) Patent No.: US 8,605,515 B2
(45) Date of Patent: Dec. 10, 2013

(54) MEMORY DEVICES AND THEIR OPERATION WITH DIFFERENT SETS OF LOGICAL ERASE BLOCKS

(75) Inventor: Frankie F. Roohparvar, Monte Sereno, CA (US)

(73) Assignee: Round Rock Research, LLC, Jersey City, NJ (US)

( * ) Notice: Subject to any disclaimer, the term of this patent is extended or adjusted under 35 U.S.C. 154(b) by 0 days.

(21) Appl. No.: 13/493,317

(22) Filed: Jun. 11, 2012

(65) Prior Publication Data

US 2012/0243316 A1 Sep. 27, 2012

Related U.S. Application Data

(63) Continuation of application No. 13/195,308, filed on Aug. 1, 2011, now Pat. No. 8,199,587, which is a continuation of application No. 12/875,763, filed on Sep. 3, 2010, now Pat. No. 7,990,775, which is a continuation of application No. 11/699,954, filed on Jan. 30, 2007, now Pat. No. 7,791,952.

(51) Int. Cl.
*G11C 16/04* (2006.01)
*G11C 19/08* (2006.01)

(52) U.S. Cl.
CPC ............................ *G11C 19/0858* (2013.01)
USPC ............ 365/185.29; 365/185.17; 365/185.05; 365/185.11; 365/230.03; 365/218

(58) Field of Classification Search
CPC .............................. G11C 16/16; G11C 16/349
USPC .................. 365/185.11, 185.05, 185.29, 218, 365/230.03, 51

See application file for complete search history.

(56) References Cited

U.S. PATENT DOCUMENTS

| | | | |
|---|---|---|---|
| 5,339,279 | A | 8/1994 | Toms et al. |
| 5,418,752 | A | 5/1995 | Harari et al. |
| 6,513,095 | B1 | 1/2003 | Tomori |
| 6,941,411 | B2 | 9/2005 | Roohparvar |
| 2002/0080654 | A1 | 6/2002 | Shiga et al. |
| 2003/0095448 | A1 | 5/2003 | Ichige et al. |
| 2004/0083348 | A1 | 4/2004 | Chang et al. |
| 2005/0144357 | A1 | 6/2005 | Sinclair |
| 2006/0187738 | A1* | 8/2006 | Suda et al. ............... 365/230.03 |
| 2007/0124531 | A1 | 5/2007 | Nishihara |
| 2007/0124533 | A1 | 5/2007 | Estakhri et al. |
| 2007/0150694 | A1 | 6/2007 | Chang et al. |

FOREIGN PATENT DOCUMENTS

| | | |
|---|---|---|
| EP | 1063652 A2 | 12/2000 |
| WO | 2005066770 A2 | 7/2005 |

* cited by examiner

*Primary Examiner* — Thong Q Le
(74) *Attorney, Agent, or Firm* — Lerner, David, Littenberg, Krumholz & Mentlik, LLP

(57) ABSTRACT

Methods of operating memory devices include storing data of a first type in a first set of logical erase blocks and storing data of a second type in a second set of logical erase blocks. The logical erase blocks of the first set of logical erase blocks each have a first size the logical erase blocks of the second set of logical erase blocks each have a second size different than the first size.

19 Claims, 6 Drawing Sheets

MEMORY DEVICES AND THEIR OPERATION WITH DIFFERENT SETS OF LOGICAL ERASE BLOCKS

RELATED APPLICATION

This application is a Continuation of U.S. application Ser. No. 13/195,308, titled "MEMORY DEVICES AND THEIR OPERATION WITH DIFFERENT SETS OF LOGICAL ERASE BLOCKS" (allowed and scheduled to issue as U.S. Pat. No. 8,199,587 on Jun. 12, 2012), which is a Continuation of U.S. application Ser. No. 12/875,763, titled "METHODS OF OPERATING MEMORY DEVICES INCLUDING DIFFERENT SETS OF LOGICAL ERASE BLOCKS," filed Sep. 3, 2010, (now U.S. Pat. No. 7,990,775), which is a Continuation of U.S. application Ser. No. 11/699,954, titled "MEMORY DEVICE ARCHITECTURES AND OPERATION," filed Jan. 30, 2007, (now U.S. Pat. No. 7,791,952), each of which is commonly assigned and incorporated herein by reference.

TECHNICAL FIELD

The present invention relates generally to semiconductor memory devices, and in particular, the present invention relates to non-volatile memory device architectures having varying block sizes.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory and other non-volatile memory include personal computers, personal digital assistants (PDAs), digital cameras, digital media players, digital recorders, games, appliances, vehicles, wireless devices, cellular telephones, and removable memory modules, and the uses for non-volatile memory continue to expand.

Flash memory typically utilizes one of two basic architectures known as NOR flash and NAND flash. The designation is derived from the logic used to read the devices. In NOR flash architecture, a column of memory cells are coupled in parallel with each memory cell coupled to a bit line. In NAND flash architecture, a column of memory cells are coupled in series with only the first memory cell of the column coupled to a bit line.

Flash memory and other non-volatile memories are often grouped into sections called "erase blocks." Each of the cells within an erase block can be electrically programmed selectively by altering the threshold voltage of an individual cell from an initial state. However, cells of the erase block are erased, or reverted to their initial state, generally in a single operation across the entire block. Any data in the erase block that is desired to be retained by the memory device must first be copied to another location or buffer before performing the erase operation.

In part because of their large block sizes, NAND devices are primarily used for storing data, such as audio, video or image files. Such files are frequently read, but generally infrequently modified. Increasingly, however, NAND devices are being designed into embedded systems. Such systems have need for code and temporary parameter storage as well as data storage. However, code and parameter data requires relatively frequent modification, requiring frequent and extensive movement or buffering of the data in a block that is to be retained. As memory densities continue to increase, block sizes are also tending to increase, thus exacerbating this problem.

For the reasons stated above, and for other reasons stated below which will become apparent to those skilled in the art upon reading and understanding the present specification, there is a need in the art for alternative memory architectures and their operation.

DETAILED DESCRIPTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The following detailed description is, therefore, not to be taken in a limiting sense, and the scope of the present invention is defined only by the appended claims and equivalents thereof.

The memory devices of the various embodiments include memory arrays logically organized as one or more first memory erase blocks of a first size and one or more second memory erase blocks of a second size larger than the first size. The block sizes can be defined, or predetermined, by a user of the device, or during fabrication or testing. In this manner, data expected to require frequent updating can be stored in locations corresponding to the first memory erase blocks while data expected to require relatively infrequent updating can be stored in locations corresponding to the second memory erase blocks. Storing data expected to require relatively more frequent updating in smaller memory blocks facilitates a reduction in unnecessary erasing of memory cells. In addition, by providing for larger memory blocks for storing data expected to require relatively less frequent updating, efficiencies can be obtained in erasing larger quantities of memory cells concurrently.

Figure 1:
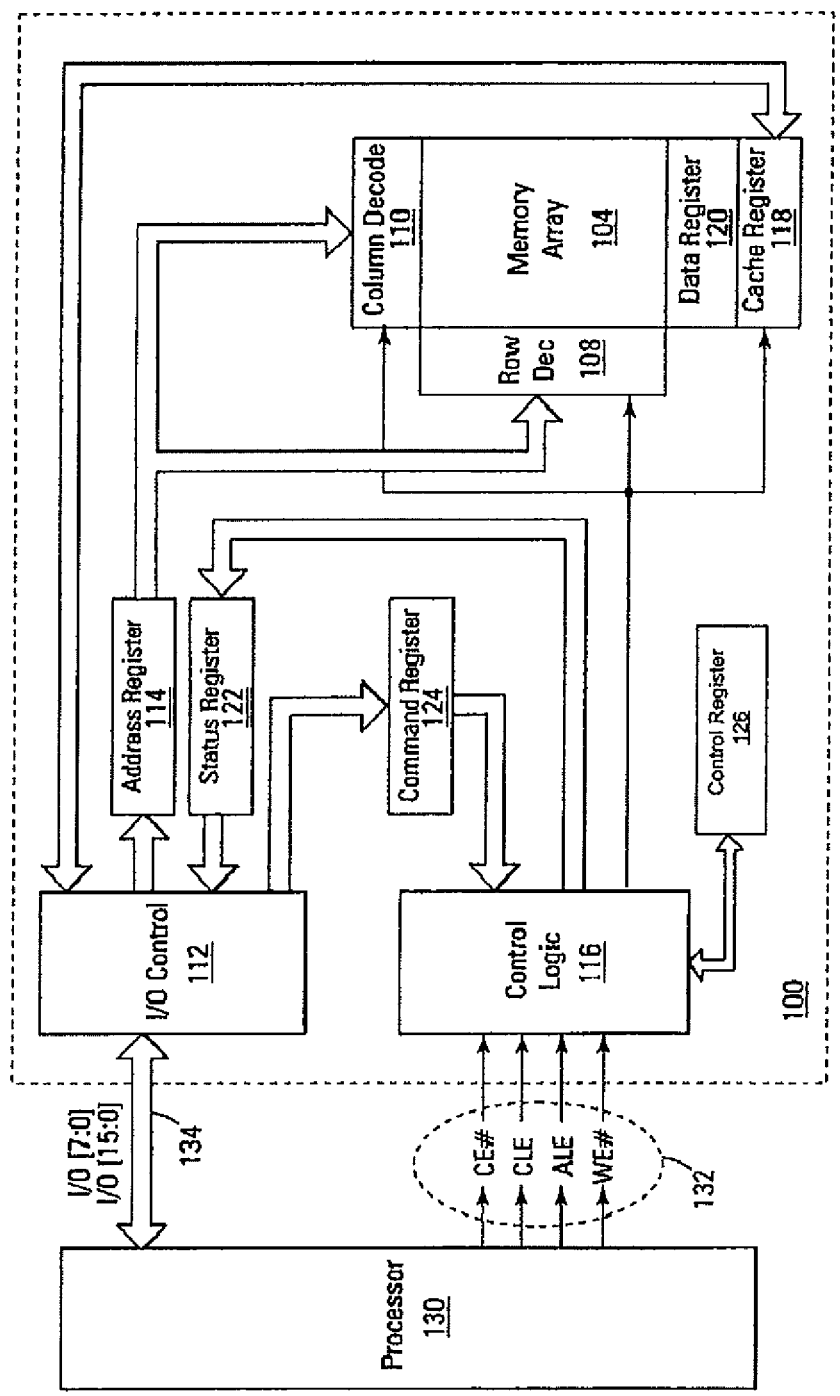
FIG. 1 is a functional block diagram of an electronic system having at least one memory device in accordance with an embodiment of the invention.

FIG. 1 is a simplified block diagram of a NAND flash memory device 100 coupled to a processor 130 as part of an electronic system, according to an embodiment of the invention. Some examples of electronic systems include personal computers, personal digital assistants (PDAs), digital cameras, digital media players, digital recorders, games, appliances, vehicles, wireless devices, cellular telephones and the like. The processor 130 may be a memory controller or other external processor.

Memory device 100 includes an array of memory cells 104 arranged in rows and columns. A row decode circuitry 108 and a column decode circuitry 110 are provided to decode address signals. Address signals are received and decoded to access memory array 104. Memory device 100 also includes input/output (I/O) control circuitry 112 to manage input of commands, addresses and data to the memory device 100 as well as output of data and status information from the memory device 100. An address register 114 is coupled between I/O control circuitry 112 and row decode circuitry 108 and column decode circuitry 110 to latch the address signals prior to decoding. A command register 124 is coupled between I/O control circuitry 112 and control logic 116 to latch incoming commands. Control logic 116 controls access to the memory array 104 in response to the commands and generates status information for the external processor 130. The control logic 116 is coupled to row decode circuitry 108 and column decode circuitry 110 to control the row decode circuitry 108 and column decode circuitry 110 in response to the addresses. Row decode circuitry 108 is configured in accordance with embodiments of the invention to facilitate selection of multiple physical blocks of memory cells for normal erase operations while permitting individual selection of single physical blocks of memory cells for other access operations. Normal erase operations are defined as erase operations performed during the use of the memory device when it is receiving its intended operational inputs.

Control logic 116 is also coupled to a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is coupled between I/O control circuitry 112 and control logic 116 to latch the status information for output to the processor 130.

Memory device 100 receives control signals at control logic 116 from processor 130 over a control link 132. The control signals may include a chip enable CE#, a command latch enable CLE, an address latch enable ALE, and a write enable WE# in accordance with the present invention. Memory device 100 receives command signals (or commands), address signals (or addresses), and data signals (or data) from processor 130 over a multiplexed input/output (I/O) bus 134 and outputs data to processor 130 over I/O bus 134.

Specifically, the commands are received over input/output (I/O) pins [0:7] of I/O bus 134 at I/O control circuitry 112 and are written into command register 124. The addresses are received over input/output (I/O) pins [0:7] of bus 134 at I/O control circuitry 112 and are written into address register 114. The data are received over input/output (I/O) pins [0:7] for an 8-bit device or input/output (I/O) pins [0:15] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [0:7] for an 8-bit device or input/output (I/O) pins [0:15] for a 16-bit device. It will be appreciated by those skilled in the art that additional circuitry and control signals can be provided, and that the memory device of FIG. 1 has been simplified to help focus on the invention. Additionally, while the memory device of FIG. 1 has been described in accordance with popular conventions for receipt and output of the various signals, it is noted that the various embodiments are not limited by the specific signals and I/O configurations described unless expressly noted herein.

A control register 126 may be coupled to control logic 116 to store one or more addresses. Addresses stored in control register 126 may be used to define portions of the memory array 104 having different logical erase block sizes. For example, the control register 126 could define starting and ending addresses for physical blocks associated with first logical erase blocks of one physical block each and starting and ending addresses for physical blocks associated with second logical erase blocks of two physical blocks each. It will be apparent that defining a starting and ending address would not require storing two addresses. For example, for a device having two sets of logical erase blocks, the control register could store just one address to define both sets of logical erase blocks, i.e., the starting address of the first set could be the first address of the memory device by default, the stored address could be the ending address of the first set, the starting address of the second set could be the stored address plus 1 and the ending address of the second set could be the last address of the memory device by default. Control register 126 could be loaded with its address value(s) in response to a command received on control link 132. Control register 126 could be formed of latches that would reset upon power-down. Alternatively, control register 126 could further include non-volatile registers of memory cells of the type used in the memory array 104 or hard-programmed devices, such as fuses, to permit the definitions to be retained upon power-down.

A software driver could be included in processor 130 as computer-readable instructions to cause the processor 130 to manage storage of data to the different portions of the memory array 104 corresponding to the various logical erase block sizes. The processor 130 could further be configured to direct data to different logical erase blocks based on characteristics of the data. For example, the processor 130 could direct the data to logical erase blocks based upon the file type being saved, the size of the file to be saved, the source of the data to be saved or some other criteria.

Figure 2:
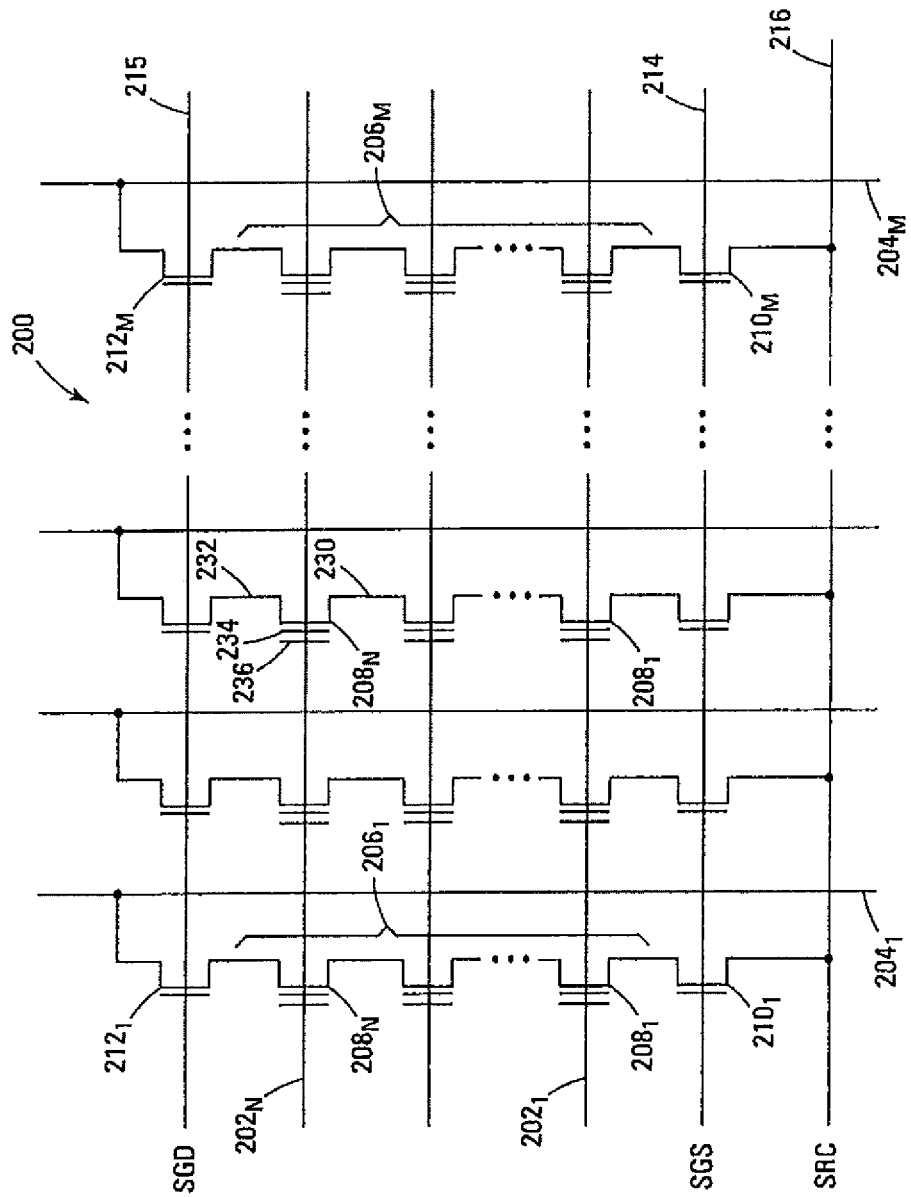
FIG. 2 is a schematic of a portion of an example NAND memory array of the prior art.

FIG. 2 is a schematic of a portion of an example NAND memory array 200 as might be found in the memory array 104 of FIG. 1. As shown in FIG. 2, the memory array 200 includes word lines $202_1$ to $202_N$ and intersecting bit lines $204_1$ to $204_M$. For ease of addressing in the digital environment, the number of word lines 202 and the number of bit lines 204 are generally each some power of two.

Memory array 200 includes NAND strings $206_1$ to $206_M$. Each NAND string includes transistors $208_1$ to $208_N$, each located at an intersection of a word line 202 and a bit line 204. The transistors 208, depicted as floating-gate transistors in FIG. 2, represent non-volatile memory cells for storage of data. The floating-gate transistors 208 of each NAND string 206 are connected in series source to drain between one or more source select gates 210, e.g., a field-effect transistor (FET), and one or more drain select gates 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. A control gate 220 of each source select gate 210 is connected to source select line 214. If multiple source select gates 210 are utilized for a given NAND string 206, they would be coupled in series between the common source line 216 and the first floating-gate transistor 208 of that NAND string 206.

The drain of each drain select gate 212 is connected to a local bit line 204 for the corresponding NAND string at a drain contact 228. For example, the drain of drain select gate $212_1$ is connected to the local bit line $204_1$ for the corresponding NAND string $206_1$ at drain contact $228_1$. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$. If multiple drain select gates 212 are utilized for a given NAND string 206, they would be coupled in series between the corresponding bit line 204 and the last floating-gate transistor $208_N$ of that NAND string 206.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of the floating-gate transistors 208 are those NAND strings 206 coupled to a given local bit line 204. A row of the floating-gate transistors 208 are those transistors commonly coupled to a given word line 202. Other forms of transistors 208 may also be utilized with embodiments of the invention, such as NROM, magnetic or ferroelectric transistors and other transistors capable of being programmed to assume one of two or more data states. Although the NAND memory array 200 is typical of NAND architecture, other configurations of non-volatile memory are understood in the art. However, the various embodiments described herein are not limited by the architecture of the memory array.

Figure 3:
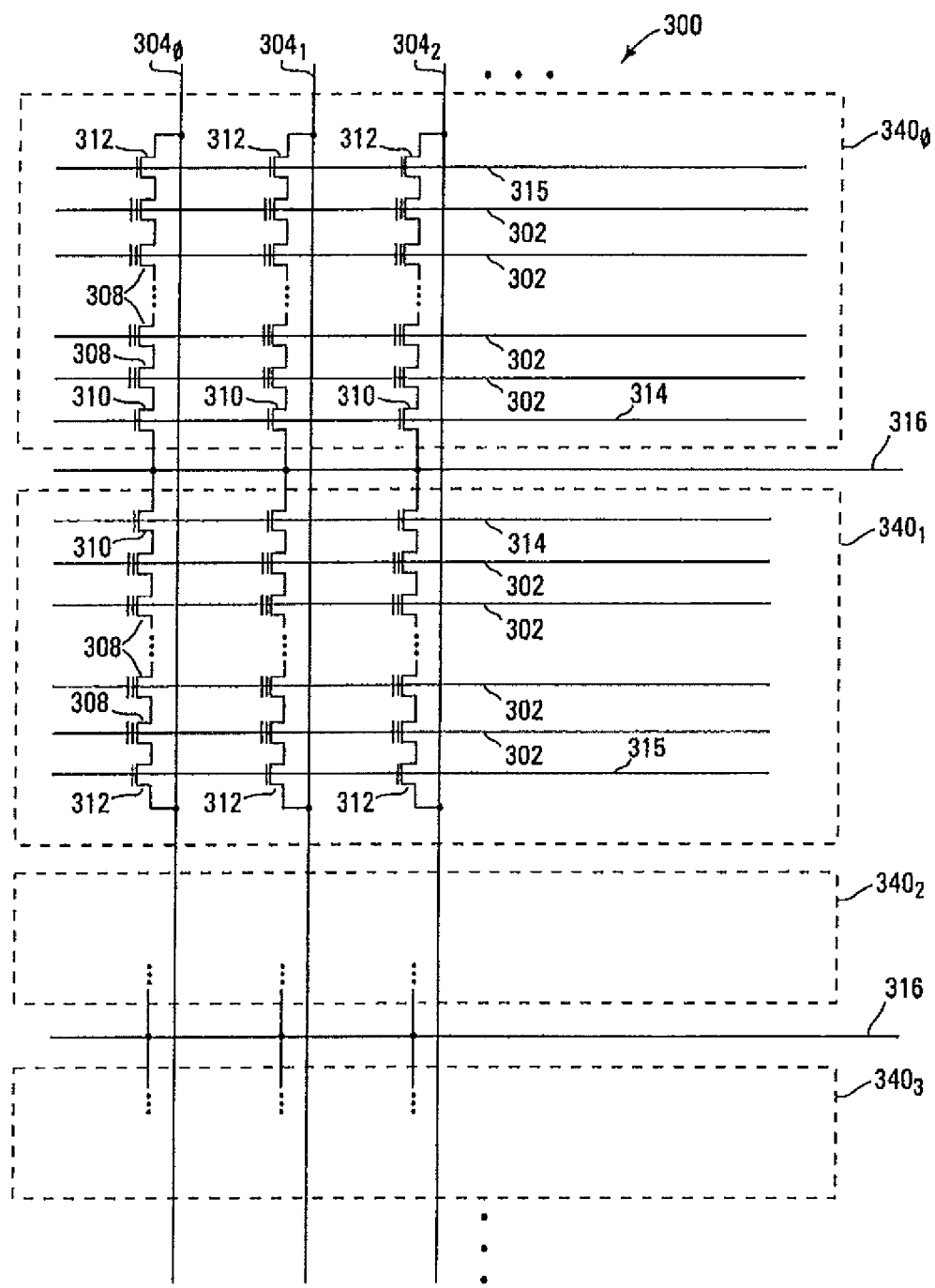
FIG. 3 is a schematic of a portion of a NAND memory array showing physical block architecture as might be used with an embodiment of the invention

FIG. 3 is a schematic of a portion of a NAND memory array 300 as a portion of memory array 104 of FIG. 1 showing physical block architecture as might be used with an embodiment of the invention. The memory cells 308 of the array 300 are substantially as described with reference to FIG. 2. As shown in FIG. 3, the memory array 300 is organized into physical blocks of memory cells 340. For the various embodiments, each erase block may contain one or more physical blocks 340.

Four physical blocks of memory cells, i.e., $340_0$, $340_1$, $340_2$ and $340_3$, are depicted in FIG. 3. While fewer physical blocks could be defined, desirable configurations could contain substantially greater numbers of physical blocks. Each physical block 340 is depicted to include three bit lines $304_0$, $304_1$ and $304_2$. While fewer bit lines could be defined, desirable configurations could contain substantially greater numbers of bit lines. Each physical block 340 includes one string of memory cells 308 coupled to each of its bit lines 304, and with each of the strings of memory cells coupled to a source line 316. Although not required, adjacent blocks 340 may share a source line 316. For example, physical blocks $340_0$ and $340_1$ may share source line $316_{0-1}$, physical blocks $340_2$ and $340_3$ may share source line $316_{2-3}$, and so on. Each source select gate 310 or SGS is located at an intersection of a bit line 304 and a source select line 314, while each drain select gate 312 or SGD is located at an intersection of a bit line 304 and a drain select line 315. Although depicted to include only one source select gate 310 and one drain select gate 312, each string of memory cells 308 may include multiple select gates as described with reference to FIG. 2.

Figure 4:
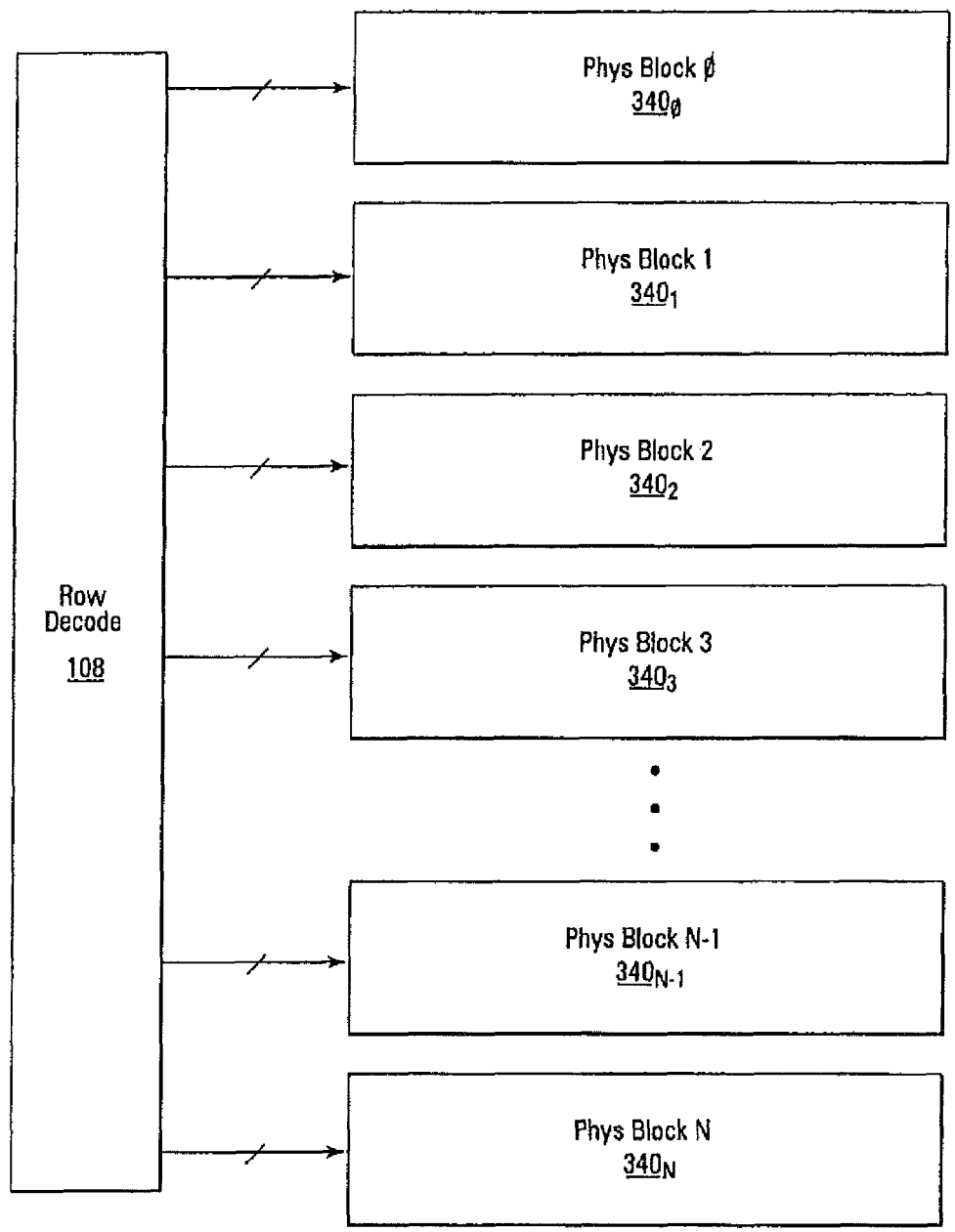
FIG. 4 is a block diagram of a portion of a memory device showing physical block selection in accordance with an embodiment of the invention.

FIG. 4 is a block diagram of a portion of a memory device showing physical block selection in accordance with an embodiment of the invention. To create logical erase blocks containing more than one physical block 340, the memory device would be adapted to facilitate selection of multiple physical blocks 340 during an erase operation as a single erase block containing multiple strings per bit line, yet individually select those same physical blocks 340 during read and program operations such that only one string per bit line is being read or programmed at a time. For example, where even and odd physical blocks 340 share a source line, it may be desirable that only one physical block 340 be active for any one source line. In this circumstance, a multiple-string erase block might contain two or more even physical blocks, e.g., physical block $340_0$ and physical block $340_2$. During an erase operation, both of the physical blocks $340_0$ and $340_2$ would be selected by row decode circuitry 108, i.e., word lines in both of the physical blocks $340_0$ and $340_2$ would be activated. But, during read and program operations, only one of the physical blocks $340_0$ or $340_2$ would be selected by row decode circuitry 108, i.e., word lines in only one of the physical blocks $340_0$ or $340_2$ would be driven with either a pass voltage or a read voltage. Alternatively, adjacent or multiple contiguous physical blocks 340 could form a multiple-string erase block. Similar to the previous example, during an erase operation, all physical blocks 340 of the multiple-string erase block would be selected, but during read and program operations, only one of the constituent physical blocks 340 would be activated. And while the foregoing examples focused on even/odd, adjacent and contiguous physical blocks 340 making up a multiple-string erase block, such logical erase blocks could use any combination of physical blocks 340 as will be apparent herein.

For the various embodiments, the logical erase blocks have at least two different sizes, i.e., one or more first erase blocks contain X physical blocks 340 and one or more second erase blocks contain Y physical blocks 340, where X is an integer value equal to or greater than one, Y is an integer value equal to or greater than two, and X does not equal Y. As an example, a memory device may have first erase blocks containing one physical block 340 per first erase block, such that an erase operation of a first erase block erases one string of memory cells per bit line, and second erase blocks containing four physical blocks 340 per second erase block, such that an erase operation of a second erase block erases four strings of memory cells per bit line. It should be apparent that the charge pumps or other circuitry for generating internal voltages would have to be sized to provide sufficient current for erasing multiple strings of memory cells per bit line.

Figure 5:
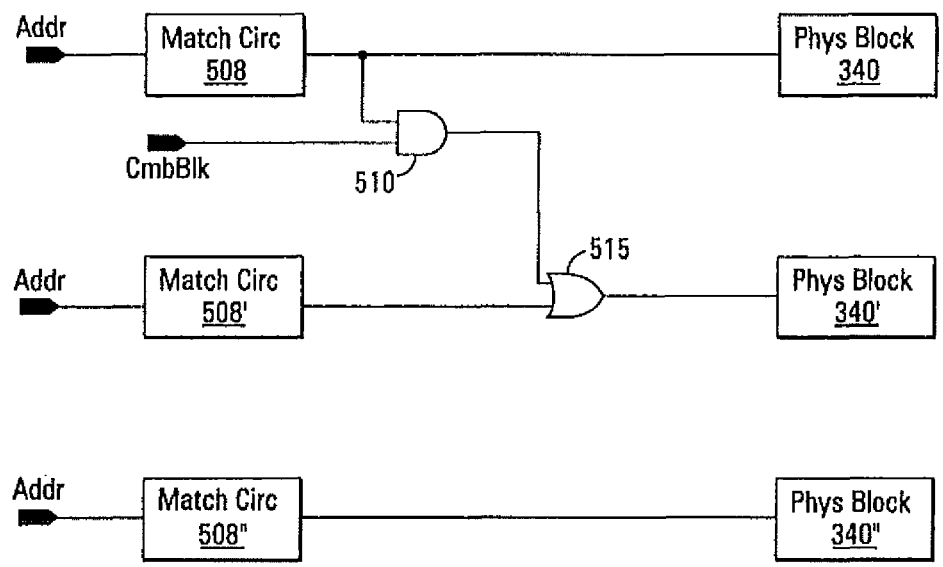
FIG. 5 is a block diagram showing one example of logic for selecting multiple physical blocks for erase operations and individual physical blocks for other operations in accordance with an embodiment of the invention.

FIG. 5 is a block diagram showing one example of logic to facilitate selecting multiple physical blocks 340 for erase operations and individual physical blocks 340 for read and program operations. Row decode circuitry 108 of FIGS. 1 and 3 generally includes match circuitry corresponding to each physical block that analyzes an incoming address signal and activates its corresponding physical block if the address signal matches the address of the physical block. For example, if the address signal Addr matched the address of the physical block 340, the output of match circuit 508 would be logic high, if the address signal Addr matched the address of the physical block 340', the output of match circuit 508' would be logic high, and if the address signal Addr matched the address of the physical block 340'', the output of match circuit 508'' would be logic high.

By adding appropriate logic, the output of a first or master match circuit can be used to select its corresponding physical block and one or more physical blocks corresponding to second or slave match circuits. FIG. 5 shows just one example of how this can be done. In FIG. 5, the output of match circuit 508 is provided to a first input of AND gate 510, and an output of the AND gate 510 is provided to a first input of OR gate 515. The output of match circuit 508' if provided to a second input of OR gate 515, and an output of the OR gate 515 provides for selection of the physical block 340'. A control signal CmbBlk is indicative of a desire to combine multiple physical blocks for selection. For example, if the control signal CmbBlk has a logic low value, the output of the AND gate 510 is logic low and the OR gate 515 has an output that is responsive to the output of the match circuit 508'. However, if the control signal CmbBlk has a logic high value, the output of the AND gate 510 is responsive to the output of the master match circuit 508, allowing the physical block 508' to be selected if the address signal Addr matches the address of the physical block 508. Thus, the control logic of the memory device would set the control signal CmbBlk to a logic high value if it is desired to select multiple physical blocks 340 for erasure, and set the control signal CmbBlk to a logic low value if it is desired to select individual physical blocks 340 for reading or programming. To combine more than two physical blocks into a logical erase block, the master match circuit 508 could be coupled to additional physical blocks in a manner similar to the coupling of match circuit 508 to physical block 340'. As noted, this is just one example of how multiple physical blocks 340 could be concurrently selected for erasure as a logical erase block while permitting individual selection of physical blocks 340 for other operations.

Match circuit 508'' is neither a master match circuit nor a slave match circuit and is responsive to the address signal Addr in exclusively selecting its corresponding physical block 340''. In this manner, physical blocks 340 and 340' could form one logical erase block having two physical blocks while physical block 340'' could form a different logical erase block having only physical block 340''. While FIG. 5 depicts a first erase block having one physical block and a second erase block having two physical blocks, the various embodiments could provide for additional or alternative logical erase block sizes.

Although the example of FIG. 5 depicts a hardware configuration for concurrently selecting multiple physical blocks sharing the same bit lines, the access circuitry could programmatically activate multiple physical blocks in response to a single logical block address. In that manner, any combination of physical blocks could be used to define a logical erase block.

In practice, a first portion of the memory array corresponding to smaller logical erase blocks could be reserved for system data, such as operation code and temporary parameter data, while a second portion of the memory array corresponding to larger logical erase blocks could be reserved for relatively static data storage, such as user data. The reserved portions could be hard-coded into the memory device such as through the use of fusible elements, or they could be programmable such as through the setting of volatile or non-volatile registers defining logical address ranges for each portion. Programmable registers are commonly used to define timing characteristics, voltage levels and other operating parameters for memory devices. Additional portions of the memory array corresponding to different logical block sizes could also be defined. As just one example, a first portion having one physical block per logical erase block may be reserved for temporary parameter values, a second portion having two physical blocks per logical erase block may be reserved for operation code, a third portion having four physical blocks per logical erase block may be reserved for user data and a fourth portion having eight physical blocks per logical erase block may be reserved for archival data. In erasing the different logical erase blocks, the memory device could be configured such that all physical blocks of a logical erase block could be erased in response to an address corresponding to any one of the physical blocks of the logical erase block. Alternatively, the memory device could be configured such that all physical blocks of an erase block could be erased in response to an address corresponding to a first one of the physical blocks of the logical erase block, but physical blocks could be individually erased in response to addresses corresponding to any of the other physical blocks of the logical erase block.

Figure 6:
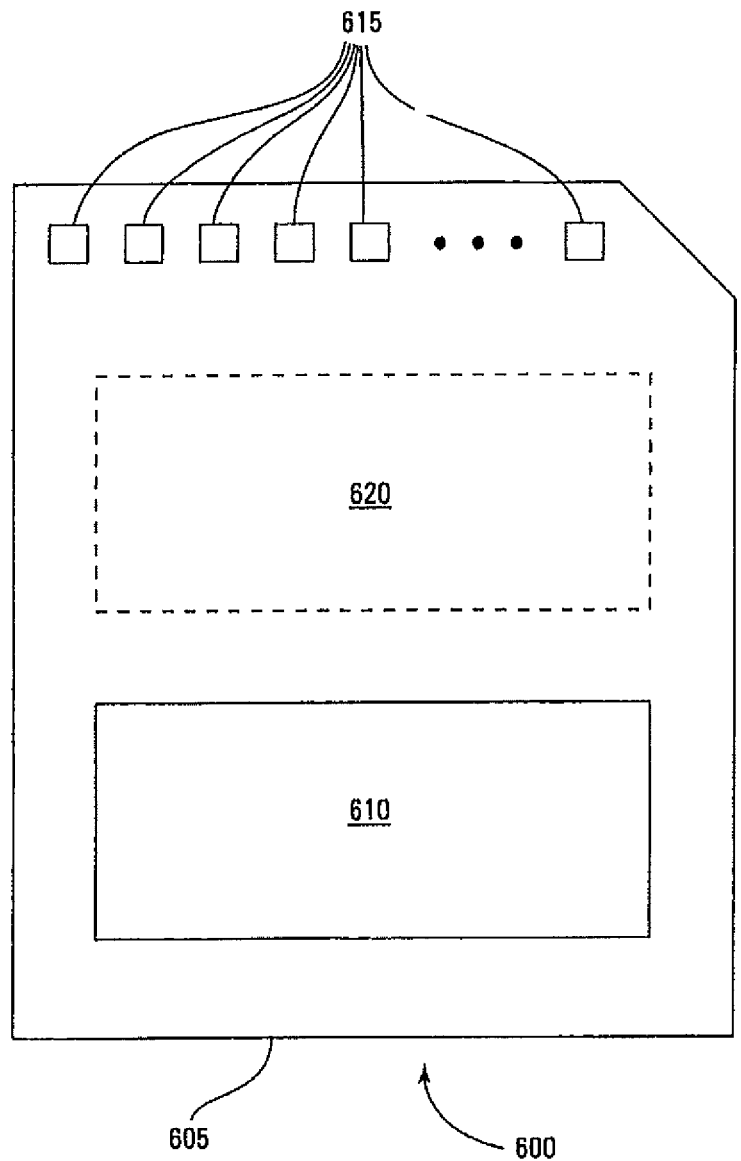
FIG. 6 is a functional block diagram of a memory module having at least one memory device in accordance with an embodiment of the invention.

FIG. 6 is an illustration of a memory module 600 in accordance with an embodiment of the invention. Memory module 600 is illustrated as a memory card, although the concepts discussed with reference to memory module 600 are applicable to other types of removable or portable memory, e.g., USB flash drives, and are intended to be within the scope of "memory module" as used herein. In addition, although one example form factor is depicted in FIG. 6, these concepts are applicable to other form factors as well.

In some embodiments, memory module 600 will include a housing 605 (as depicted) to enclose one or more memory devices 610, though such a housing is not essential to all devices or device applications. At least one memory device 610 is a non-volatile memory in accordance with an embodiment of the invention. Where present, the housing 605 includes one or more contacts 615 for communication with a host device. Examples of host devices include personal computers, PDAs, digital cameras, digital media players, digital recorders, games, appliances, vehicles, wireless devices, cellular telephones, memory card readers, interface hubs and the like. For some embodiments, the contacts 615 are in the form of a standardized interface. For example, with a USB flash drive, the contacts 615 might be in the form of a USB Type-A male connector. In general, contacts 615 provide an interface for passing control, address and/or data signals between the memory module 600 and a host having compatible receptors for the contacts 615.

The memory module 600 may optionally include additional circuitry 620 which may be one or more integrated circuits and/or discrete components. For some embodiments, the additional circuitry 620 may include a memory controller for controlling access across multiple memory devices 610 and/or for providing a translation layer between an external host and a memory device 610. For example, there may not be a one-to-one correspondence between the number of contacts 615 and a number of I/O connections to the one or more memory devices 610. Thus, a memory controller could selectively couple an I/O connection (not shown in FIG. 6) of a memory device 610 to receive the appropriate signal at the appropriate I/O connection at the appropriate time or to provide the appropriate signal at the appropriate contact 615 at the appropriate time. Similarly, the communication protocol between a host and the memory module 600 may be different than what is required for access of a memory device 610. A memory controller could then translate the command sequences received from a host into the appropriate command sequences to achieve the desired access to the memory device 610. Such translation may further include changes in signal voltage levels in addition to command sequences.

The additional circuitry 620 may further include functionality unrelated to control of a memory device 610 such as logic functions as might be performed by an ASIC (application specific integrated circuit). Also, the additional circuitry 620 may include circuitry to restrict read or write access to the memory module 600, such as password protection, biometrics or the like. The additional circuitry 620 may include circuitry to indicate a status of the memory module 600. For example, the additional circuitry 620 may include functionality to determine whether power is being supplied to the memory module 600 and whether the memory module 600 is currently being accessed, and to display an indication of its status, such as a solid light while powered and a flashing light while being accessed. The additional circuitry 620 may further include passive devices, such as decoupling capacitors to help regulate power requirements within the memory module 600.

CONCLUSION

The memory devices of the various embodiments include non-volatile memory arrays logically organized to have erase blocks of at least two different sizes. The various embodiments further provide for concurrent erasure of multiple physical blocks of memory cells, while providing for individual selection of those physical blocks for read and program operations. In this manner, data expected to require frequent updating can be stored in locations corresponding to first erase blocks having a first size while data expected to require relatively infrequent updating can be stored in locations corresponding to second erase blocks larger than the first erase blocks. Storing data expected to require relatively more frequent updating in smaller memory blocks facilitates a reduction in unnecessary erasing of memory cells. In addition, by providing for larger memory blocks for storing data expected to require relatively less frequent updating, efficiencies can be obtained in erasing larger quantities of memory cells concurrently.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. An electronic system, comprising:
a processor; and
one or more memory devices coupled to the processor, wherein at least one of the memory devices comprises:
an array of memory cells organized into a plurality of erasable physical blocks;
a control register storing an address of the array of memory cells, wherein the address is indicative of at least one of a starting address and an ending address for physical blocks associated with a particular portion of the array of memory cells having a particular logical erase block size; and
wherein the processor is configured to select storage of data among different physical blocks of the array of memory cells.

2. The electronic system of claim 1, wherein the address is indicative of the ending address for physical blocks associated with the particular portion of the array of memory cells having the particular logical erase block size, and wherein the address is indicative of a starting address for physical blocks associated with a different portion of the array of memory cells having a second logical erase block size different than the particular logical erase block size.

3. The electronic system of claim 2, wherein the starting address for physical blocks associated with the particular portion of the array of memory cells having the particular logical erase block size is a first physical block address of the memory device.

4. The electronic system of claim 2, wherein an ending address for physical blocks associated with the different portion of the array of memory cells having the second logical erase block size is a last physical block address of the memory device.

5. The electronic system of claim 2, wherein the starting address for physical blocks associated with the different portion of the array of memory cells having the second logical erase block size is the next physical block address after the ending address for physical blocks associated with the particular portion of the array of memory cells having the particular logical erase block size.

6. The electronic system of claim 2, wherein the particular logical erase block size comprises one or more physical blocks, wherein the second logical erase block size comprises two or more physical blocks.

7. The electronic system of claim 2, wherein the particular logical erase block size comprises two or more physical blocks, wherein the second logical erase block size comprises one or more physical blocks.

8. The electronic system of claim 1, wherein the address is indicative of the starting address for physical blocks associated with the particular portion of the array of memory cells having the particular logical erase block size, and wherein the control register further stores a second address indicative of the ending address for physical blocks associated with the particular portion of the array of memory cells having the particular logical erase block size.

9. The electronic system of claim 8, wherein the control register further stores a third address indicative of a starting address for physical blocks associated with a different portion of the array of memory cells having a second logical erase block size different than the particular logical erase block size, and wherein the control register further stores a fourth address indicative of an ending address for physical blocks associated with the different portion of the array of memory cells having the second logical erase block size.

10. The electronic system of claim 1, wherein the control register comprises latches.

11. The memory device of claim 10, wherein the latches reset upon power-down of the memory device.

12. The electronic system of claim 1, wherein the control register comprises non-volatile registers.

13. The electronic system of claim 12, wherein the non-volatile registers are selected from the group consisting of non-volatile memory cells and hard-programmed devices.

14. The electronic system of claim 1, wherein the processor directs data to different physical blocks of the array of memory cells based on characteristics of the data.

15. An electronic system, comprising:
- a processor; and
- one or more memory devices coupled to the processor, wherein at least one of the memory devices comprises:
- an array of memory cells organized into a plurality of erasable physical blocks;
- a control register storing addresses of the array of memory cells, wherein the addresses are each indicative of a starting address and an ending address for physical blocks associated with different portions of the array of memory cells, wherein each portion of the array of memory cells has a particular logical erase block size; and
- wherein the processor is configured to control storage of data to different physical blocks of the array of memory cells.

16. The electronic system of claim 15, wherein each portion of the array of memory cells has a logical erase block size that is different than a logical erase block size of any of the other portions of the array of memory cells.

17. The electronic system of claim 15, wherein each address is indicative of the ending address for physical blocks associated with one portion of the array of memory cells and a starting address for physical blocks associated with another portion of the array of memory cells.

18. The electronic system of claim 15, wherein each particular address is a physical block address of a last physical block for physical blocks associated with a particular portion of the array of memory cells and wherein a starting address for physical blocks associated with a subsequent portion of the array of memory cells is a next physical block address after the particular address.

19. The electronic system of claim 15, wherein the processor directs data to different physical blocks of the array of memory cells based on characteristics of the data.

* * * * *